United States Patent
Kurose

(10) Patent No.: US 10,148,281 B1
(45) Date of Patent: Dec. 4, 2018

(54) ANALOG-TO-DIGITAL CONVERTER AND WIRELESS COMMUNICATION DEVICE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Daisuke Kurose, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/876,363

(22) Filed: Jan. 22, 2018

(30) Foreign Application Priority Data

Sep. 5, 2017 (JP) ................................. 2017-170255

(51) Int. Cl.
*H03M 1/46* (2006.01)
*H03M 1/12* (2006.01)

(52) U.S. Cl.
CPC ......... *H03M 1/462* (2013.01); *H03M 1/1245* (2013.01); *H03M 1/468* (2013.01)

(58) Field of Classification Search
None
See application file for complete search history.

(56) References Cited

U.S. PATENT DOCUMENTS

| 2012/0032824 A1 | 2/2012 | Yoshioka | |
| 2013/0009796 A1* | 1/2013 | Sakiyama | H03M 1/0624 341/110 |
| 2013/0099953 A1* | 4/2013 | Tsai | H03M 1/462 341/161 |
| 2016/0126962 A1* | 5/2016 | Masuko | H03L 7/0818 341/118 |
| 2016/0254821 A1* | 9/2016 | Luo | H03M 1/125 341/161 |

FOREIGN PATENT DOCUMENTS

JP 5561010 B2 7/2014

* cited by examiner

*Primary Examiner* — Howard Williams
(74) *Attorney, Agent, or Firm* — Holtz, Holtz & Volek PC

(57) ABSTRACT

According to one embodiment, an analog-to-digital converter includes a first digital-to-analog converter, a comparator configured to digitally output based on a first clock signal, a clock generator configured to generate the first clock signal from an input clock signal, and a controller configured to control the first digital-to-analog converter. The clock generator sets a cycle of the first clock signal to a first cycle if the input clock signal is at a first logic level, and sets the cycle of the first clock signal to a second cycle shorter than the first cycle if the input clock signal is at a second logic level.

20 Claims, 9 Drawing Sheets

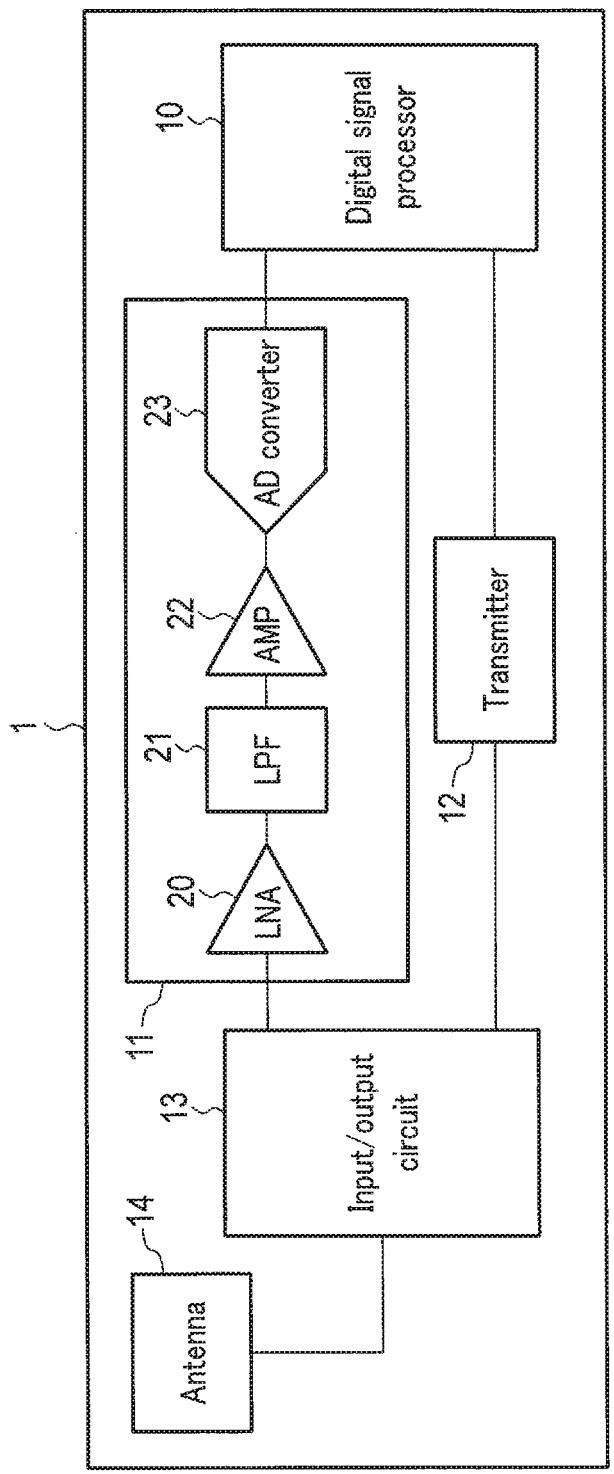
F I G. 1

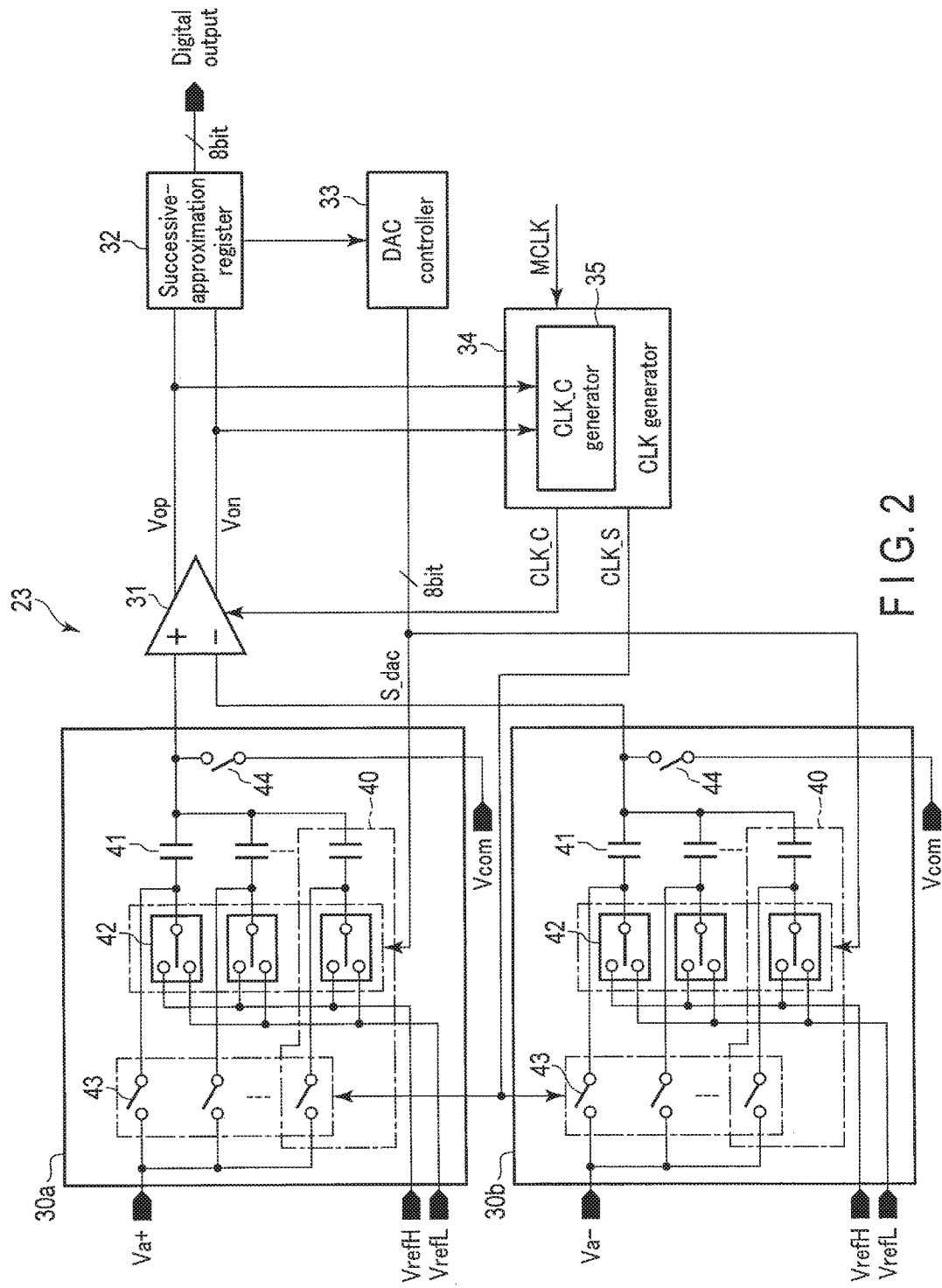
F I G. 2

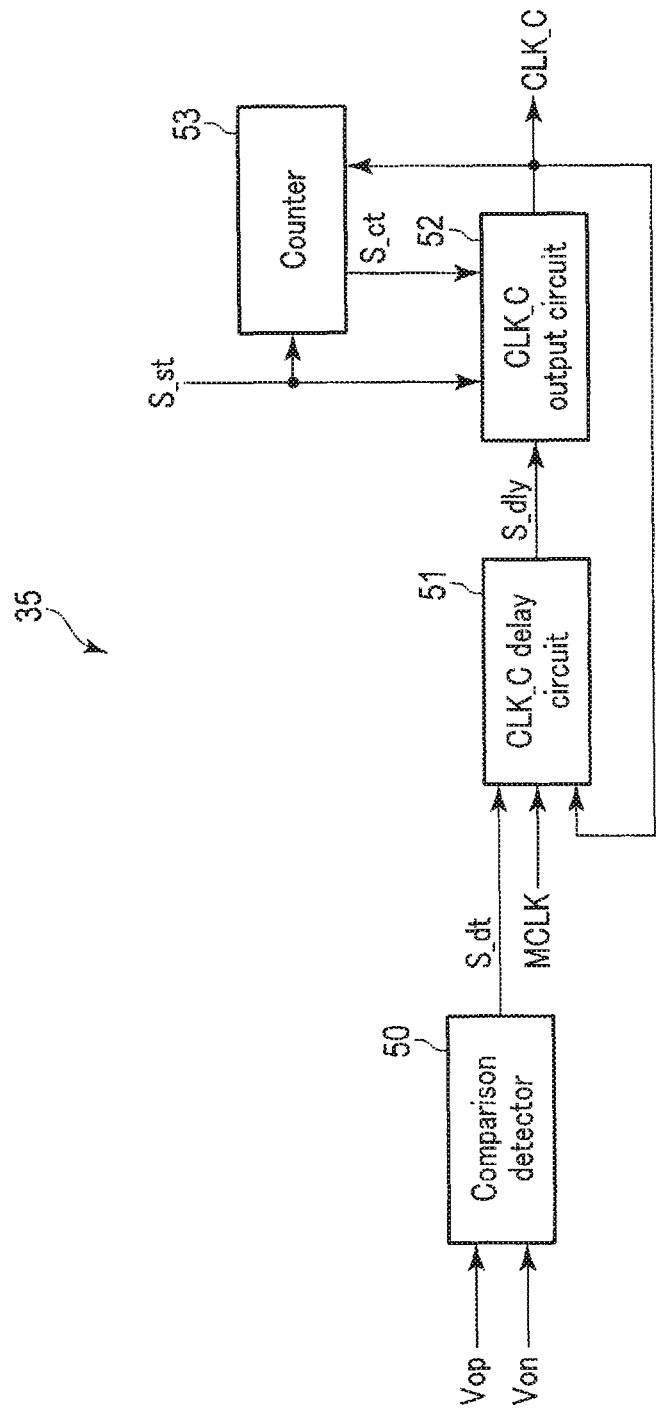
F I G. 5

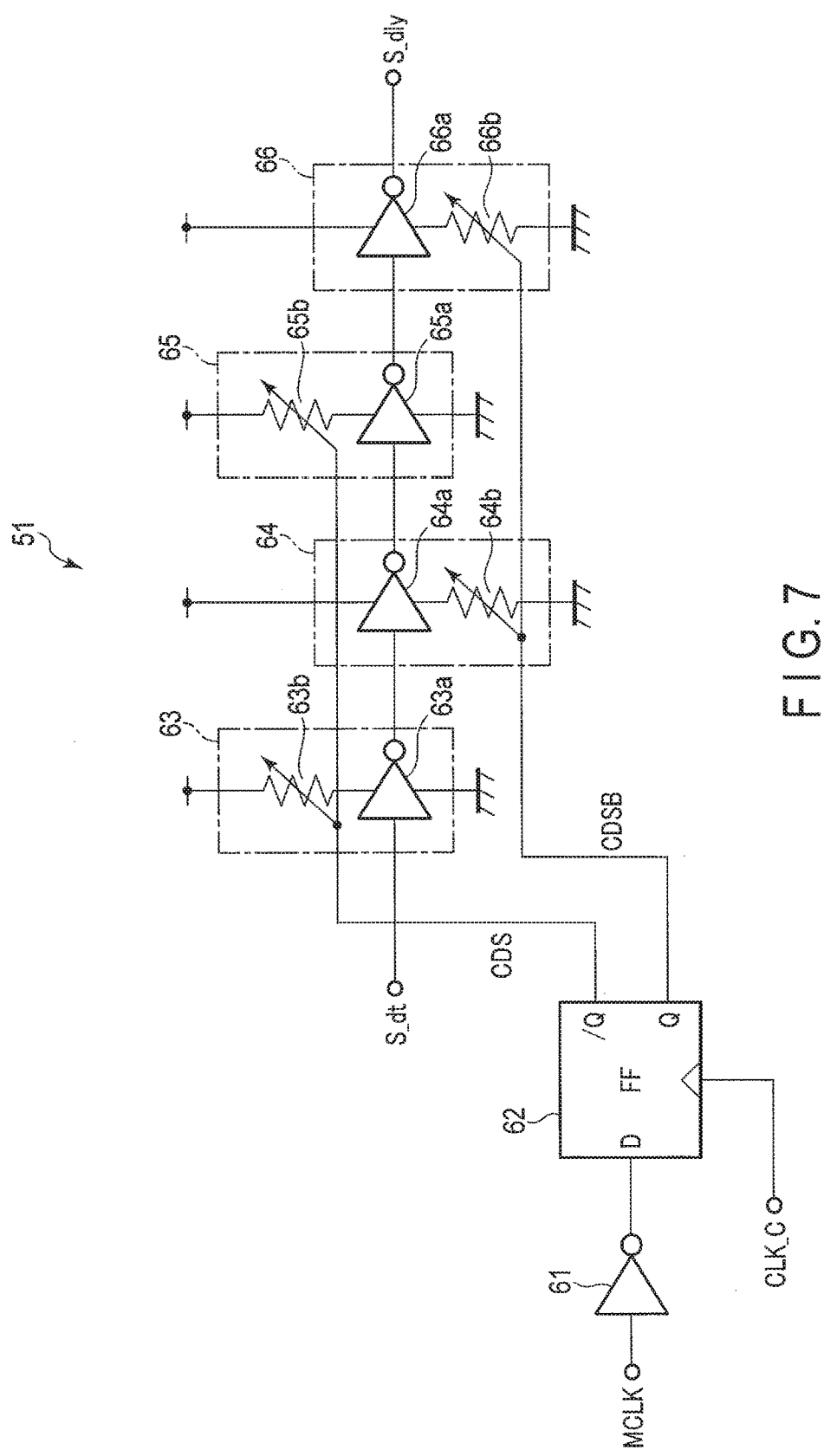
F I G. 7

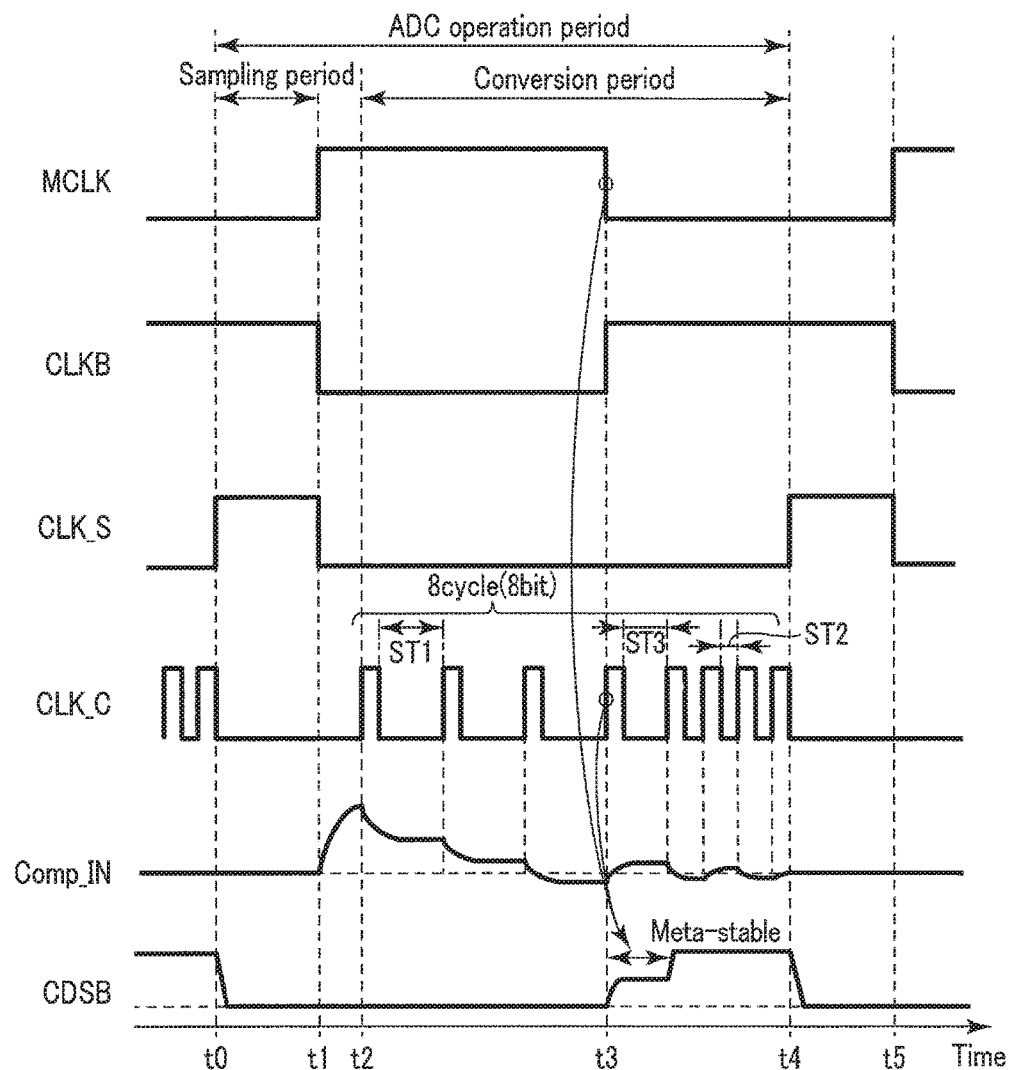
F I G. 10

US 10,148,281 B1

ANALOG-TO-DIGITAL CONVERTER AND WIRELESS COMMUNICATION DEVICE

CROSS-REFERENCE TO RELATED APPLICATIONS

This application is based upon and claims the benefit of priority from Japanese Patent Application No. 2017-170255, filed Sep. 5, 2017, the entire contents of which are incorporated herein by reference.

FIELD

Embodiments described herein relate generally to analog-to-digital converters and wireless communication devices.

BACKGROUND

As a type of analog-to-digital converter (hereinafter, also called "AD converter"), successive-approximation type AD converters are known. Analog-to-digital (AD) conversion operations by successive-approximation type AD converters involve a period for sampling input analog signals and a period for converting the sampled input analog signals (successive approximation period). Reducing the period for converting is an important factor in improving the processing speed of the AD converters.

BRIEF DESCRIPTION OF THE DRAWINGS

FIG. 1 is a block diagram exemplifying a configuration of a wireless communication device according to a first embodiment.

FIG. 2 is one block diagram for an analog-to-digital converter according to the first embodiment.

FIG. 5 is one circuit diagram for a CMP_C generator in an analog-to-digital converter according to a second embodiment.

FIG. 7 is one circuit diagram for a CLK_C delay circuit in an analog-to-digital converter according to a third embodiment.

FIG. 10 is a timing chart exemplifying operations of the analog-to-digital converter according to the fourth embodiment.

DETAILED DESCRIPTION

Figure 3:
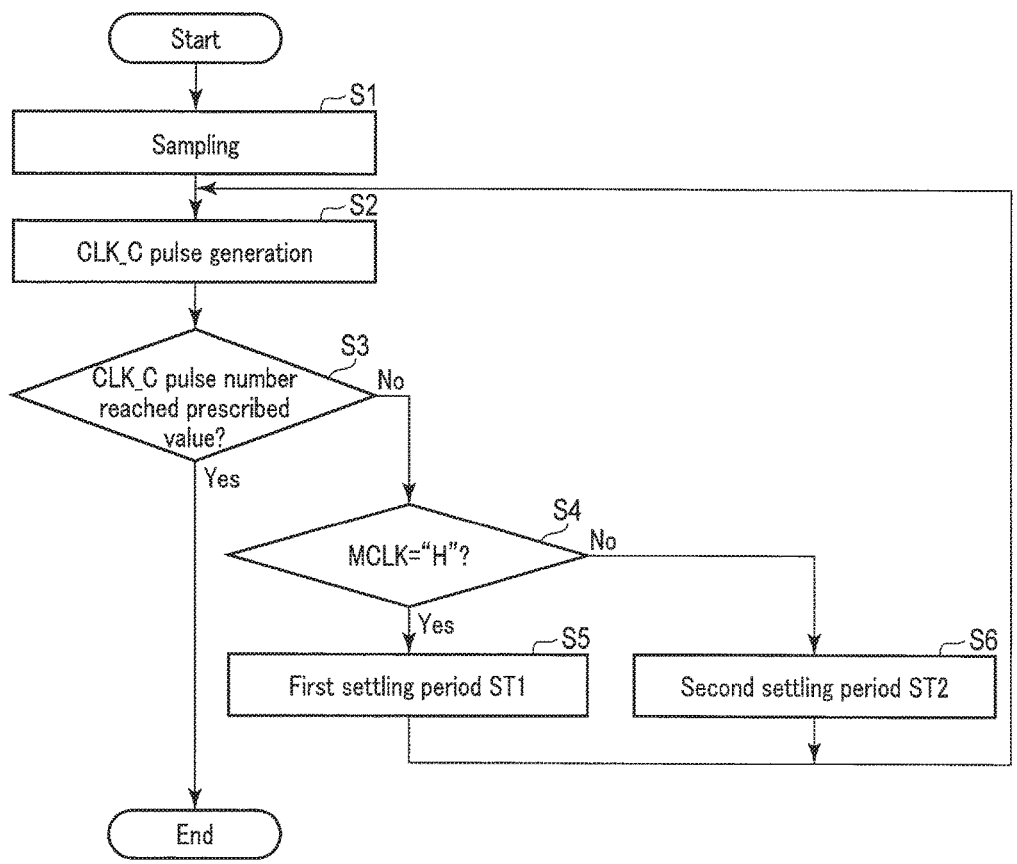
FIG. 3 is a flowchart exemplifying operations of the analog-to-digital converter according to the first embodiment.

In general, according to one embodiment, an analog-to-digital converter includes: a first digital-to-analog converter which is configured to generate a first analog voltage based on a sampled first analog signal and a digital code; a comparator to which the first analog voltage is input and which is configured to digitally output based on a first clock signal; a clock generator which is configured to generate the first clock signal from an input clock signal; and a controller which is configured to generate the digital code based on the digital output of the comparator and to control the first digital-to-analog converter. The clock generator sets a cycle of the first clock signal to a first cycle if the input clock signal is at a first logic level, and sets the cycle of the first clock signal to a second cycle shorter than the first cycle if the input clock signal is at a second logic level.

1. First Embodiment

An analog-to-digital converter (hereinafter, also called "AD converter") and a wireless communication device according to the first embodiment will be described. The following descriptions will assume that this AD converter is a successive-approximation type AD converter.

1.1. General Configuration of Wireless Communication Device

First, an entire configuration of the wireless communication device will be described. A wireless communication device 1 includes a digital signal processor 10, a receiver 11, a transmitter 12, an input/output circuit 13, and an antenna 14.

The receiver 11 converts radio-frequency signals (hereinafter, also called "analog signals") from an external device into digital signals, and transmits the digital signals to the digital signal processor 10. The receiver 11 includes a low noise amplifier (LNA) 20, a low pass filter (LPF) 21, an amplifier (AMP) 22, and an AD converter 23.

The low noise amplifier 20 amplifies weak analog signals received via the antenna 14 and the input/output circuit 13, with relatively low noise.

The low pass filter 21 attenuates the analog signals amplified by the low noise amplifier 20 for frequency components lower than the cut-off frequency.

The amplifier 22 amplifies the analog signals filtered by the low pass filter 21 to an amplitude (voltage) required for the processing in the AD converter 23.

The AD converter 23 converts the input analog signals into digital signals and transmits the digital signals to the digital signal processor 10.

The digital signal processor 10 performs various processing based on the digital signals received from the receiver 11. The digital signal processor 10 also transmits digital signals to the transmitter 12 based on the results of various types of processing.

The transmitter 12 includes a digital-to-analog converter (not shown) to convert the digital signals received from the digital signal processor 10 into analog signals, and transmits the analog signals to the input/output circuit 13.

The input/output circuit 13 transmits signals received via the antenna 14 to the receiver 11. The input/output circuit 13 also transmits signals received from the transmitter 12 to an external device via the antenna 14.

1.2 Configuration of AD Converter

Next, the configuration of the AD converter 23 will be described with reference to FIG. 2. Example of FIG. 2 shows differential signal input successive-approximation type AD converter 23 which generates 8-bit digital signals. The bit number of the digital signals generated by the AD converter 23 may be discretionarily set. The AD converter 23 may also be a successive-approximation type AD converter adapted for the input of single-phase signals.

The AD converter 23 performs successive approximation of analog signal voltages Va to a voltage based on a reference voltage Vref, sequentially from the most significant bit (MSB) to the least significant bit (LSB), and generates a digital signal. The reference voltage Vref is a voltage that constitutes a criterion for assessing the analog signal voltages Va. For example, in the assessment for the MSB, if a voltage Va is equal to or higher than ($\frac{1}{2}$)Vref ((Va−($\frac{1}{2}$)Vref)≥0), the MSB is determined to be at a "High" ("H") level (data "1"). If the voltage Va is lower than ($\frac{1}{2}$)Vref ((Va−($\frac{1}{2}$)Vref)<0), the MSB is determined to be at a "Low" ("L") level (data "0"). In the assessment for the next significant bit, if data "1" has been determined, a voltage Va is compared to a (($\frac{1}{2}$)+($\frac{1}{4}$))Vref, and if data "0" has been determined, the voltage Va is compared to a (($\frac{1}{2}$)−($\frac{1}{4}$))Vref. Similar assessment continues until the least significant bit (LSB). As such, as the digital conversion proceeds from the MSB toward the LSB, the degree of variations in the comparative voltages based on the reference voltage Vref becomes smaller as ($\frac{1}{2}$)Vref, ($\frac{1}{2^2}$)Vref, . . . , and ($\frac{1}{2^n}$)Vref (n being a bit number).

The AD converter 23 includes a digital-to-analog converter (hereinafter, "DAC") 30a, a DAC 30b, a comparator 31, a successive-approximation register 32, a DAC controller 33, and a CLK generator 34. The DACs 30a and 30b correspond to respective analog voltages Va+ and Va− of a differential input signal, and have similar configurations.

The DAC 30a includes three input terminals coupled to respective input terminals of the AD converter 23, namely, an input terminal for the analog voltage Va+(or may be called "analog signal input terminal"), an input terminal for a reference voltage VrefH, and an input terminal for a reference voltage VrefL. The reference voltage VrefH is a high-side reference voltage, and the reference voltage VrefL is a low-side reference voltage. The difference in potential between the reference voltages VrefH and VrefL corresponds to the voltage Vref. An output terminal of the DAC 30a is coupled to a non-inverting input terminal (+ terminal) of the comparator 31. The DAC 30a samples the analog voltages Va+ of analog signals and temporarily holds (stores) them. During the successive approximation, the DAC 30a generates analog voltages that differ for respective bits for comparison, based on 8-bit digital signals S_dac received from the DAC controller 33. The DAC 30a combines the generated analog voltage and the sampled voltage Va+, and outputs this composite voltage to the comparator 31. The DAC 30a includes multiple samplers 40 and a switching element 44. The number of the samplers 40 may be determined based on the number of bits subjected to the AD conversion by the AD converter 23. For 8-bit AD conversion, eight samplers 40 are provided, for example.

Each sampler 40 includes a capacitive element 41 and switching elements 42 and 43. The capacitive elements 41 included in the multiple samplers 40 are different in capacitance value each other. For example, for the 8-bit AD converter 23, the capacitance values of the capacitive elements 41 are set so that voltages ($\frac{1}{2^1}$)Vref, ($\frac{1}{2^2}$)Vref, . . . , and ($\frac{1}{2^8}$)Vref can be generated based on the digital signals S_dac. The capacitive element 41 includes a first electrode coupled to an output terminal of the switching element 42, and a second electrode coupled to the output terminal of the DAC 30a.

The switching element 42 includes a first input terminal to which the voltage VrefH is applied, and a second input terminal to which the voltage VrefL is applied. The switching element 42 selects the first input terminal or the second input terminal according to the signal S_dac when the switching element 43 is in an OFF state.

The switching element 43 includes an input terminal coupled to the input terminal for the analog voltage Va+, and an output terminal coupled to the first electrode of the capacitive element 41. The switching element 43 connects the input terminal for the analog voltage Va+ to the corresponding sampler 40 according to a sampling clock signal CLK_S received from the CLK generator 34.

The switching element 44 applies a voltage Vcom (e.g., ground voltage VSS) according to a clock signal (not shown) received from the CLK generator 34.

When, for example, the DAC 30a samples an analog signal, the switching element 43 in each sampler 40 is set to an ON state, and the switching element 42 is set to a state where neither the first nor the second input terminal is selected. The switching element 44 is then set to an ON state. This causes the capacitive element 41 in each sampler 40 to be charged by the analog voltage Va+.

When the DAC 30a generates an analog voltage according to the digital signal S_dac, the switching element 43 in each sampler 40 is set to an OFF state. The switching element 42 then selects the first or the second input terminal according to the digital signal S_dac.

The DAC 30b is of a similar configuration to the DAC 30a, so its descriptions will be omitted. The differences are that an input terminal of the DAC 30b is coupled to an input terminal of the AD converter 23 for the analog voltage Va−, and that an output terminal of the DAC 30b is coupled to an inverting input terminal (− terminal) of the comparator 31.

The comparator 31 is a differential output type comparator, and outputs positive-side digital signals (voltage Vop) and negative-side digital signals (voltage Von). Output terminals of the comparator 31 are coupled to the successive-approximation register 32 and a CLK_C generator 35, respectively. The comparator 31 compares the output voltage of the DAC 30a to the output voltage of the DAC 30b for each bit, and sends the comparison result to the successive-approximation register 32 and the CLK_C generator 35. The comparator 31 performs comparison if a comparator clock signal CLK_C received from the CLK_C generator 35 is at, for example, the "H" level.

The successive-approximation register 32 temporarily holds an 8-bit digital signal received from the comparator 31. The 8-bit digital signal held in the successive-approximation register 32 is transmitted to the DAC controller 33 and the output terminal of the AD converter 23.

The DAC controller 33 transmits the 8-bit digital signal S_dac to the DACs 30a and 30b to control the DACs 30a and 30b. More specifically, the DAC controller 33 generates the digital signal S_dac based on the digital signal of each bit (result of the successive approximation) received from the successive-approximation register 32, and transmits the digital signal S_dac to the DACs 30a and 30b.

The CLK generator 34 generates the sampling clock signal CLK_S and the comparator clock signal CLK_C based on, for example, a master clock signal MCLK (i.e., input clock signal). The master clock signal MCLK is an input clock signal received by the AD converter 23 from external devices (including other circuits in the wireless communication device 1). The CLK generator 34 includes the CLK_C generator 35.

The CLK_C generator 35 generates the comparator clock signal CLK_C based on the master clock signal MCLK. More specifically, the CLK_C generator 35 generates, for example, eight "H" (high)-level pulses in dealing with 8-bit AD conversion. In this instance, the CLK_C generator 35 varies inter-pulse periods (hereinafter, "settling periods"), that is, an amount of delay up to generation of the next pulse, at the timing of the fall of the master clock signal MCLK, for example. The CLK_C generator 35 keeps a constant length for "H"-level pulses, irrespective of the amount of delay. Assuming that one cycle of the comparator clock signal CLK_C is defined by the time points to output "H"-level pulses by the comparator clock signal CLK_C (period between the rise to the "H" level and the next rise to the "H" level), the CLK_C generator 35 varies the cycle of the comparator clock signal CLK_C based on the master clock signal MCLK.

During the settling period, the DACs 30a and 30b undergo charge and discharge of the capacitive elements 41 for the AD conversion of the next bit. Accordingly, the output voltages of the DACs 30a and 30b each saturate during the settling period.

1.3 Overall Flow of AD Conversion Operations

Next, the overall flow of the AD conversion operations will be described with reference to FIG. 3. FIG. 3 shows an example of the AD conversion operations for one cycle.

As shown in FIG. 3, the AD converter 23 first samples analog signals (step S1). More specifically, in the sampling period, the CLK generator 34 sets the sampling clock signal CLK_S to the "H" level. The DACs 30a and 30b take in respective analog input signals (analog voltages Va+ and Va−) based on the "H"-level sampling clock signal CLK_S.

After the sampling, the CLK_C generator 35 generates a pulse signal of the comparator clock signal CLK_C (step S2). More specifically, the CLK generator 34 sets the sampling clock signal CLK_S to the "L" level, in response to, for example, the timing of the rise of the master clock signal MCLK. Then, after the sampling clock signal CLK_S has been set to the "L" level, the CLK_C generator 35 generates a pulse of the comparator clock signal CLK_C and transmits it to the comparator 31. Upon receipt of the "H"-level comparator clock signal CLK_C, the comparator 31 compares the analog voltages received from the DACs 30a and 30b, and sends the comparison result to the successive-approximation register 32 and the CLK_C generator 35.

If the pulse number of the comparator clock signals CLK_C is not yet reach a prescribed number (for example, eight for the case of 8-bit conversion) (step S3_No), the CLK_C generator 35 sets the settling period.

More specifically, if the master clock signal MCLK is at the "H" level (step S4_Yes), the CLK_C generator 35 sets the settling period after the pulse generation to a first settling period ST1 (step S5). On the other hand, if the master clock signal MCLK is at the "L" level (step S4 No), the CLK_C generator 35 sets the settling period after the pulse generation to a second settling period ST2 (step S6). The relationship between the first settling period ST1 and the second settling period ST2 is given as ST1>ST2. That is, the second settling period ST2 provides an amount of delay before generation of the next pulse, which is smaller than that of the first settling period ST1. As such, upon the master clock signal MCLK becoming the "L" level, the CLK_C generator 35 reduces the pulse cycle of the comparator clock signal CLK_C. Assuming that the cycle of the comparator clock signal CLK_C with the "H"-level master clock signal MCLK is a first cycle, and that the cycle of the comparator clock signal CLK_C with the "L"-level master clock signal MCLK is a second cycle, the relationship, first cycle >second cycle, is given.

After the passage of the set settling period, the AD converter 23 returns to the operation in step S2, where a pulse of the comparator clock signal CLK_C is generated.

Upon the pulse number of the comparator clock signal CLK_C reaching the prescribed number (step S3_Yes), the AD converter 23 terminates the AD conversion operations for one cycle.

1.4 Each Signal in AD Conversion Operations

Figure 4:
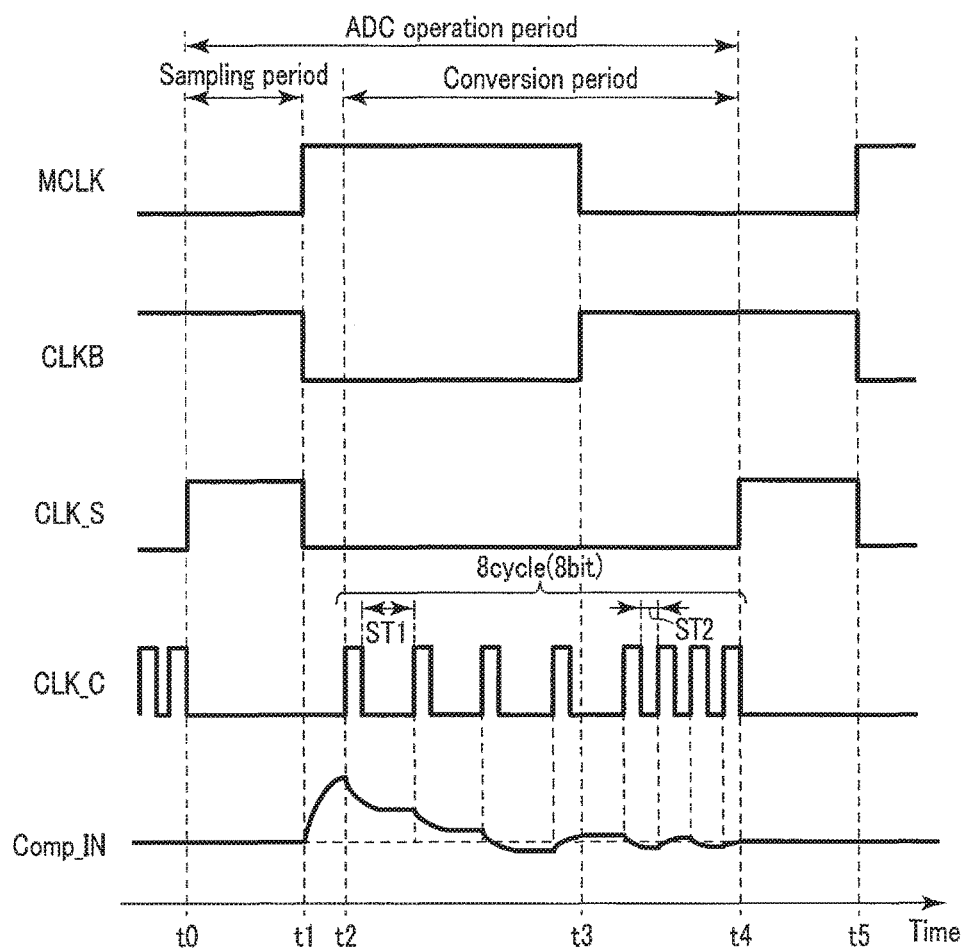
FIG. 4 is a timing chart exemplifying operations of the analog-to-digital converter according to the first embodiment.

Next, each signal in the AD conversion operations will be described with reference to FIG. 4. FIG. 4 is an example showing in particular the AD converter operation period (hereinafter, "ADC operation period") for one cycle of the AD conversion. Also, FIG. 4 illustrates one example of the potential difference (symbol "Comp_IN") between the comparator's non-inverting input terminal and inverting input terminal, that is, the potential difference between the output voltages of the DACs 30a and 30b. However, different waveforms may occur depending on analog signals and the results of comparison between respective bits.

As shown in FIG. 4, the AD converter 23 starts the sampling operation at time t0. More specifically, the CLK generator 34 terminates the oscillation (pulse generation) for the comparator clock signal CLK_C in the CLK_C generator 35, and sets the sampling clock signal CLK_S to the "H" level. The DACs 30a and 30b start sampling analog signals based on the sampling clock signal CLK_S. In the following descriptions, the period from time t0 through time t1 will be called "sampling period".

At time t1, the AD converter 23 terminates the sampling. More specifically, upon the master clock signal MCLK having risen to the "H" level, or upon a clock signal CLKB having fallen, the CLK generator 34 sets the sampling clock signal CLK_S to the "L" level. The DACs 30a and 30b terminate sampling the analog signals based on the sampling clock signal CLK_S.

For the period from time t1 through time t2, the DAC 30a generates an analog voltage that is a composite voltage of the sampled voltage Va+ and the voltage (½)Vref generated based on the digital signal S_dac corresponding to the MSB. The DAC 30b likewise generates an analog voltage that is a composite voltage of the sampled voltage Va− and the voltage (½)Vref generated based on the digital signal S_dac. Then, the output voltages of the DACs 30a and 30b each saturate during the period from time t1 through time t2. For example, in the example shown in FIG. 4, the potential difference Comp_IN between the output voltages of the DACs 30a and 30b saturates on the positive voltage side.

At time t2, the AD converter 23 starts successive approximation. For the period from time t2 through time t4, the AD converter 23 performs, for example, 8-bit successive approximation. In the following descriptions, the period from time t2 to time t4 will be called "conversion period (successive-approximation period)".

More specifically, for the period from time t2 through time t3, the CLK_C generator 35 sets the first settling period ST1 based on the "H"-level master clock signal MCLK ("L"-level clock signal CLKB). In the example shown in FIG. 4, the CLK_C generator 35 generates four pulses with the first settling period ST1 intervening therebetween. Also, for the period from time t3 through time t4, the CLK_C generator 35 sets the second settling period ST2 based on the "L"-level master clock signal MCLK ("H"-level clock signal CLKB). The CLK_C generator 35 then generates, for example, four pulses with the second settling period ST2 intervening therebetween. That is, the first settling period ST1 as a relatively longer settling period is set for the conversion of higher 4 bits including the MSB, and the second settling period ST2 as a relatively shorter settling period is set for the conversion of lower 4 bits including the LSB. The bit numbers corresponding to the first settling period and the second settling period may each be discretionarily set.

In the conversion for each bit, the output voltages of the DACs 30a and 30b, that is, the potential difference Comp_IN, saturates before passage of the first settling period ST1 or the second settling period ST2. At this time, as the AD conversion proceeds from the MSB to LSB, the changes in the output voltages of the DACs 30a and 30b become smaller or, in other words, the degree of variations in the potential difference Comp_IN becomes smaller. As such, the period required for the potential difference Comp_IN to saturate (stabilizing period) is made shorter.

At time t4, the AD converter 23 terminates the AD conversion operations for the first cycle, and starts the second AD conversion operations as in the time t0. The period from time t0 through time t4 corresponds to the ADC operation period for one cycle.

At time t5, the AD converter 23 terminates the sampling as in time t1. The period from time t1 through time t5 indicates one cycle of the master clock signal MCLK.

1.5 Effect of Present Embodiment

With the configurations according to this embodiment, the processing speed of a wireless communication device installed with an AD converter in the receiver can be improved. This effect will be explained.

In a successive-approximation type AD converter, when an MSB to an LSB are sequentially subjected to successive approximation, the degree of variations in the DAC's output voltages becomes smaller as the AD conversion proceeds from the MSB to the LSB. Accordingly, as the AD conversion proceeds from the MSB to the LSB, the stabilizing period required for the saturation of the DAC's output voltages becomes shorter. On the other hand, successive-approximation type AD converters generally perform successive approximation in constant cycles, irrespective of the bits for AD conversion. This case represents a setting state where the settling periods, i.e., the cycles of comparator clock signals, are excessively long for the conversion of lower bits which involve a relatively short stabilizing period for the DAC's output voltages. In the AD conversion operations for one cycle, the sampling period decreases by as much as the extended cycles of comparator clock signals, i.e., the prolonged conversion period (successive-approximation period). Thus, this would hamper the improvement of the processing speed of AD converters.

In contrast, in the configurations according to the present embodiment, the AD converter 23 includes the CLK_C generator 35. The CLK_C generator 35 is capable of changing the length of the settling periods for the comparator clock signals CLK_C, that is, the amount of delay up to generation of the next pulse, based on the master clock signal MCLK. Thereby, the cycles of the comparator clock signals CLK_C can be changed. More specifically, the settling periods can be set shorter in response to, for example, the timing of the fall of the master clock signal MCLK. Accordingly, by reducing the settling periods, i.e., the cycles of the comparator clock signals CLK_C, for the AD conversion of lower bits which involve a relatively short stabilizing period for DAC's output voltages, the conversion period can be made shorter. Therefore, the AD conversion operations for one cycle can be shortened, and the processing capacity can be improved.

2. Second Embodiment

Next, an AD converter and a wireless communication device according to the second embodiment will be described. For the second embodiment, a concrete example of the CLK_C generator 35 from the first embodiment will be set forth. The following descriptions will concentrate on the differences from the first embodiment.

2.1 Configuration of CLK_C Generator

The CLK_C generator 35 will be described with reference to FIG. 5.

As shown in FIG. 5, the CLK_C generator 35 includes a comparison detector 50, a CLK_C delay circuit 51, a CLK_C output circuit 52, and a counter 53.

The comparison detector 50 includes two input terminals to which voltages Vop and Von are applied. A detection signal S_dt is output from an output terminal of the comparison detector 50. For example, the comparison detector 50 monitors the voltages Vop and Von, sets the detection signal S_dt to the "H" level for the period during which the comparison operation is performed by the comparator 31 (when there is a difference between the voltages Vop and Von), and sets the detection signal S_dt to the "L" level for the period during which the comparison operation is not performed (when there is no difference between the voltages Vop and Von).

The CLK_C delay circuit 51 includes three input terminals to which the detection signal S_dt, the master clock signal MCLK, and the comparator clock signal CLK_C are input, respectively. A delay signal S_dly is output from an output terminal of the CLK_C delay circuit 51. The CLK_C delay circuit 51 outputs the delay signal S_dly by delaying the detection signal S_dt based on the master clock signal MCLK and the comparator clock signal CLK_C. More specifically, the CLK_C delay circuit 51, for example, takes in the master clock signal MCLK at the timing that the comparator clock signal CLK_C rises to the "H" level. Then, if the master clock signal MCLK is at the "H" level, the CLK_C delay circuit 51 outputs the "L"-level delay signal S_dly that is the "L"-level detection signal S_dt delayed by a first delay period (first settling period ST1). If the master clock signal MCLK is at the "L" level, the CLK_C delay circuit 51 outputs the "L"-level delay signal S_dly that is the "L"-level detection signal S_dt delayed by a second delay period (second settling period ST2). Also, the CLK_C delay circuit 51 outputs the "H"-level delay signal S_dly by delaying the "H"-level detection signal S_dt by a constant delay amount, irrespective of the master clock signal MCLK. The amount of delay in this instance corresponds to the "H"-level period (pulse length) of the comparator clock signal CLK_C.

The CLK_C output circuit 52 includes three input terminals to which the delay signal S_dly, a conversion start signal S_st from the CLK generator 34, and an output signal S_ct from the counter 53 are input. The comparator clock signal CLK_C is output from an output terminal of the CLK_C output circuit 52. The CLK_C output circuit 52 starts generating the first pulse of the comparator clock signal CLK_C upon the conversion start signal S_st having set to, for example, the "H" level. Thereafter, the CLK_C output circuit 52 repeats the pulse generation based on the delay signals S_dly. Also, the CLK_C output circuit 52 terminates the pulse generation upon, for example, receipt of a "H"-level output signal S_ct from the counter 53.

The counter 53 counts the pulse number of the comparator clock signals CLK_C output from the CLK_C output circuit 52. More specifically, upon receipt of the conversion start signal S_st, the counter 53 sets the output signal S_ct to the "L" level, resets the count number, and starts counting. The counter 53 then sets the output signal S_ct to the "H" level when the pulse count number has reached a prescribed value (for example, eight for the case of 8-bit conversion).

2.2 Operations of CLK_C Generator

Next, the operation of the CLK_C generator 35 will be described with reference to FIG. 6.

Figure 6:
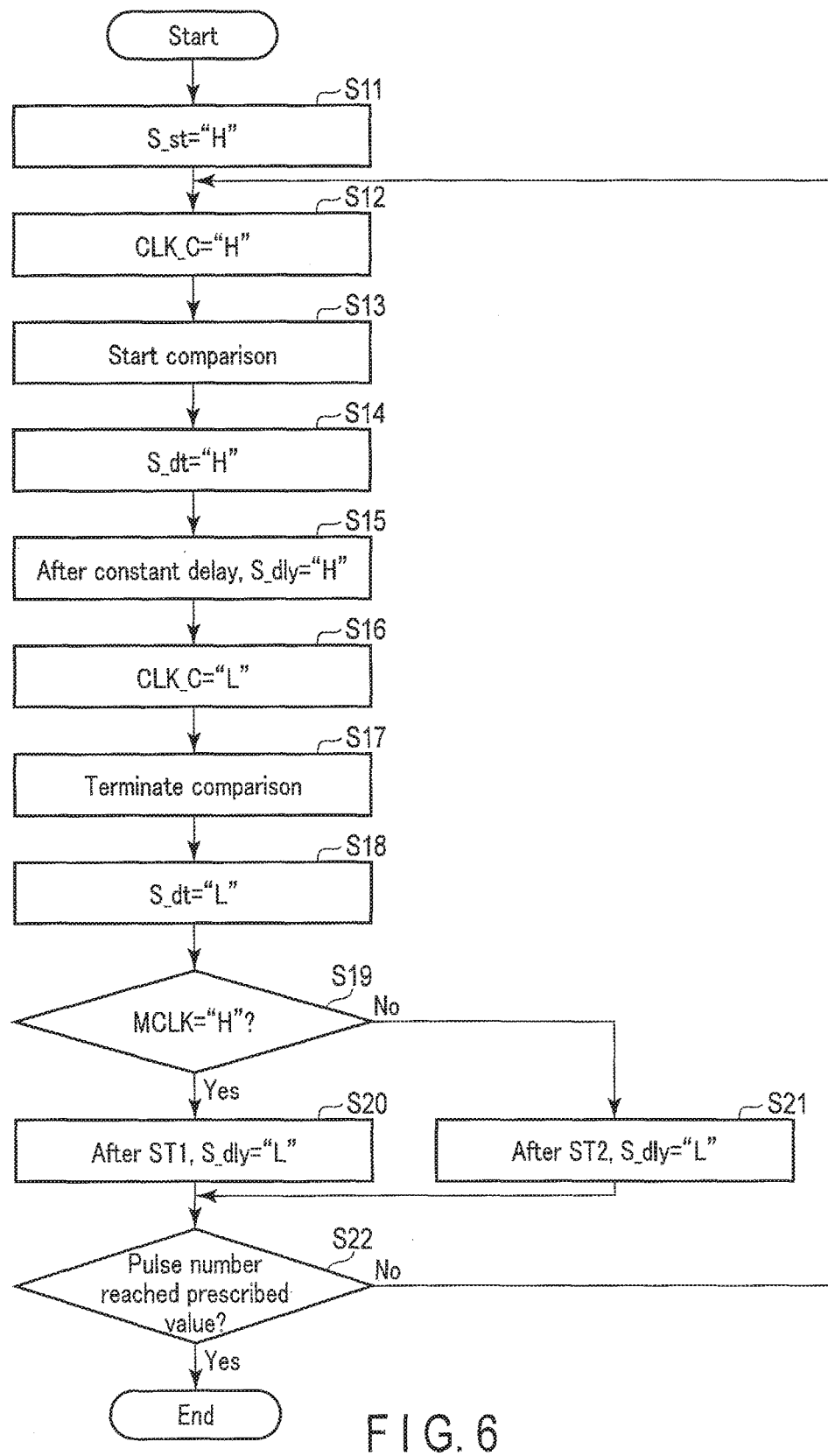
FIG. 6 is a flowchart exemplifying operations of a CLK_C generator in the analog-to-digital converter according to the second embodiment.

As shown in FIG. 6, the CLK_C output circuit 52 first receives the "H"-level conversion start signal S_st (step S11), and outputs the "H"-level comparator clock signal CLK_C (step S12). The CLK_C delay circuit 51 takes in the master clock signal MCLK at the timing that the comparator clock signal CLK_C rises to the "H" level.

The comparator 31, upon receipt of the "H"-level comparator clock signal CLK_C, starts the comparison operation (step S13).

In response to the start of the comparison operation by the comparator 31, the comparison detector 50 outputs the "H"-level detection signal S_dt based on the voltages Vop and Von (step S14).

The CLK_C delay circuit 51 outputs the "H"-level delay signal S_dly by delaying the "H"-level detection signal S_dt by a constant delay period (step S15).

The CLK_C output circuit 52, upon receipt of the "H"-level delay signal S_dly, outputs the "L"-level comparator clock signal CLK_C (step S16).

The comparator 31, upon receipt of the "L"-level comparator clock signal CLK_C, terminates the comparison operation (step S17).

In response to the termination of the comparison operation by the comparator 31, the comparison detector 50 outputs the "L"-level detection signal S_dt based on the voltages Vop and Von (step S18).

If the master clock signal MCLK is at the "H" level (step S19_Yes), the CLK_C delay circuit 51 outputs the "L"-level delay signal S_dly upon passage of the first settling period ST1 since the receipt of the "L"-level detection signal S_dt (step S20). On the other hand, if the master clock signal MCLK is at the "L" level (step S19_No), the CLK_C delay circuit 51 outputs the "L"-level delay signal S_dly upon passage of the second settling period ST2 since the receipt of the "L"-level detection signal S_dt (step S21).

If the pulse number of the comparator clock signal CLK_C is not reached yet a prescribed number (step S22_No), the operation returns to step S12, where the CLK_C output circuit 52 outputs the "H"-level comparator clock signal CLK_C. On the other hand, if the pulse number of the comparator clock signal CLK_C has reached the prescribed number (step S22_Yes), the counter 53 sets the signal S_ct to the "H" level. The CLK_C output circuit 52 terminates the pulse generation upon receipt of the "H"-level signal S_ct.

2.3 Effect of Present Embodiment

The configurations according to this embodiment may be applied to the first embodiment. The same effect as in the first embodiment can thereby be attained.

3. Third Embodiment

Next, an AD converter and a wireless communication device according to the third embodiment will be described. For the third embodiment, explanations of the CLK_C delay circuit 51 from the second embodiment will be set forth. The following descriptions will concentrate on the differences from the first and second embodiments.

3.1 Configuration of CLK_C Delay Circuit

The CLK_C delay circuit 51 will be described with reference to FIG. 7.

As shown in FIG. 7, the CLK_C delay circuit 51 includes an inverter 61, a flip-flop circuit 62, and first to fourth variable delay inversion circuits 63 through 66. The number of the variable delay inversion circuits may be discretionarily set as long as it is an even number, so that the delay signals S_dly will not be inverted.

The inverter 61 includes an input terminal to which the master clock signal MCLK is input. An output terminal of the inverter 61 is coupled to a data input terminal D of the flip-flop circuit 62.

The flip-flop circuit 62 includes a clock signal input terminal to which the comparator clock signal CLK_C is input. The flip-flop circuit 62 includes a data output terminal Q to output a signal CDSB, and an inversion data output terminal to output a signal CDS. The flip-flop circuit 62 takes in the inverted signal of the master clock signal MCLK (clock signal CLKB) at the timing that the comparator clock signal CLK_C rises from the "L" level to the "H" level. More specifically, if the master clock signal MCLK is at the "H" level (the clock signal CLKB is at the "L" level), the signal CDSB is set to the "L" level and the signal CDS is set to the "H" level at the timing that the comparator clock signal CLK_C rises to the "H" level. If the master clock signal MCLK is at the "L" level (the clock signal CLKB is at the "H" level), the signal CDSB is set to the "H" level and the signal CDS is set to the "L" level. Note that the master clock signal MCLK and the signal CLK_C are asynchronous.

The first variable delay inversion circuit 63 is capable of varying the speed of the "L" to "H" level inversion when inverting input signals and outputting them. The first variable delay inversion circuit 63 includes an inverter 63*a* and a variable resistor (or variable resistive element) 63*b*.

The inverter 63*a* includes an input terminal to which the detection signal S_dt is input, and an output terminal coupled to an input terminal of an inverter 64*a* of the second variable delay inversion circuit 64. The inverter 63*a* includes a supply voltage terminal coupled to a supply voltage line via the variable resistor 63*b*, and a ground voltage terminal which is grounded.

The resistance value of the variable resistor 63*b* changes based on the signal CDS. For example, the variable resistor 63*b* is rendered in a high resistance state if the signal CDS is at the "H" level, and rendered in a low resistance state if the signal CDS is at the "L" level.

Using the change in the resistance value of the variable resistor 63*b*, the inverter 63*a* can adjust the amount of current flowing into the supply voltage terminal. Accordingly, the inverter 63*a* can adjust the speed of the output signals inverting from the "L" level to the "H" level. More specifically, the amount of current flowing into the supply voltage terminal when the variable resistor 63*b* is in the high resistance state is smaller than that when the variable resistor 63*b* is in the low resistance state. As such, the speed of the "L" to "H" level inversion of the output signals of the inverter 63*a* is higher with the variable resistor 63*b* in the low resistance state (the signal CDS at the "L" level) than with the variable resistor 63*b* in the high resistance state (the signal CDS at the "H" level).

The second variable delay inversion circuit 64 is capable of varying the speed of the "H" to "L" level inversion when inverting input signals and outputting them. The second variable delay inversion circuit 64 includes the inverter 64*a* and a variable resistor (or variable resistive element) 64*b*.

The inverter 64*a* includes an output terminal coupled to an input terminal of an inverter 65*a* of the third variable delay inversion circuit 65. The inverter 64*a* includes a supply voltage terminal coupled to the supply voltage line, and a ground voltage terminal grounded via the variable resistor 64b.

The resistance value of the variable resistor 64b changes based on the signal CDSB. For example, the variable resistor 64b is in a low resistance state if the signal CDSB is at the "H" level, and in a high resistance state if the signal CDSB is at the "L" level.

Using the change in the resistance value of the variable resistor 64b, the inverter 64a can adjust the amount of current flowing into the ground voltage terminal. Accordingly, the inverter 64a can adjust the speed of the output signals inverting from the "H" level to the "L" level. More specifically, the amount of current flowing into the ground voltage terminal when the variable resistor 64b is in the high resistance state is smaller than that when the variable resistor 64b is in the low resistance state. As such, the speed of the "H" to "L" level inversion of the output signals of the inverter 64a is higher with the variable resistor 64b in the low resistance state (the signal CDSB at the "H" level) than with the variable resistor 64b in the high resistance state (the signal CDSB at the "L" level).

The third variable delay inversion circuit 65 has the same circuit configuration as the first variable delay inversion circuit 63. The third variable delay inversion circuit 65 is capable of varying the speed of the "L" to "H" level inversion when inverting input signals and outputting them. The third variable delay inversion circuit 65 includes the inverter 65a and a variable resistor (or variable resistive element) 65b. The inverter 65a includes an output terminal coupled to an input terminal of an inverter 66a of the fourth variable delay inversion circuit 66.

The fourth variable delay inversion circuit 66 has the same circuit configuration as the second variable delay inversion circuit 64. The fourth variable delay inversion circuit 66 is capable of varying the speed of the "H" to "L" level inversion when inverting input signals and outputting them. The fourth variable delay inversion circuit 66 includes the inverter 66a and a variable resistor (or variable resistive element) 66b. The inverter 66a includes an output terminal to output the delay signal S_dly.

With the foregoing configurations, therefore, when the master clock signal MCLK is at the "H" level, the signal CDS is set to the "H" level and the signal CDSB is set to the "L" level. Then, the first to fourth variable resistors 63b through 66b are rendered in the high resistance state. This will increase the amount of delay in response to the detection signal S_dt being at the "L" level, and the "L"-level delay signal S_dly will be output upon passage of the first settling period ST1. Also, when the master clock signal MCLK is at the "L" level, the signal CDS is set to the "L" level and the signal CDSB is set to the "H" level. Then, the first to fourth variable resistors 63b through 66b are rendered in the low resistance state. This will decrease the amount of delay in response to the detection signal S_dt being at the "L" level, and the "L"-level delay signal S_dly will be output upon passage of the second settling period ST2. If the detection signal S_dt is at the "H" level, the detection signal S_dt is delayed by a constant delay period for outputting the delay signal S_dly, irrespective of the master clock signal MCLK, or the state of the signals CDS and CDSB.

3.2 Effect of Present Embodiment

The configurations according to this embodiment may be applied to the first and the second embodiments. The same effect as in the first and the second embodiments can thereby be attained.

4. Fourth Embodiment

Next, an AD converter and a wireless communication device according to the fourth embodiment will be described. For the fourth embodiment, explanations of the first to fourth variable delay inversion circuits 63 through 66 from the third embodiment will be set forth. The following descriptions will concentrate on the differences from the first through third embodiments.

4.1 Configuration of First Variable Delay Inversion Circuit

The first variable delay inversion circuit 63 will be described with reference to FIG. 8. Note that the third variable delay inversion circuit 65 is of the same configuration.

Figure 8:
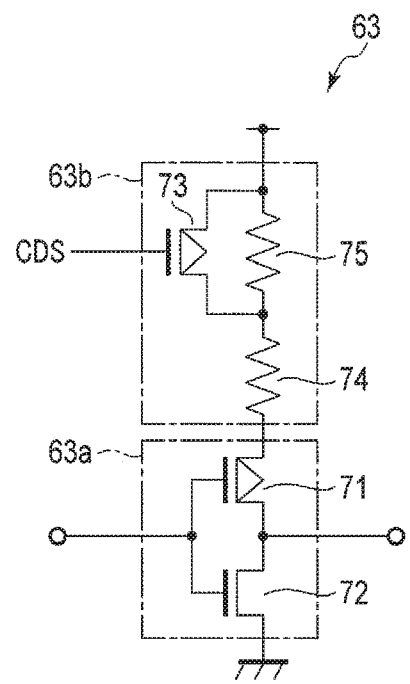
FIG. 8 is one circuit diagram for a first variable delay inversion circuit in an analog-to-digital converter according to a fourth embodiment.

As shown in FIG. 8, the inverter 63a of the first variable delay inversion circuit 63 includes a p-channel MOS transistor (or "PMOS transistor") 71 and an n-channel MOS transistor (or "NMOS transistor") 72.

The PMOS transistor 71 includes a source coupled to the supply voltage line via the variable resistor 63b, and a drain coupled to a drain of the NMOS transistor 72 and the output terminal of the inverter 63a. A gate of the PMOS transistor 71 and a gate of the NMOS transistor 72 are coupled to the input terminal of the inverter 63a. A source of the NMOS transistor 72 is grounded (coupled to the ground voltage line).

The variable resistor 63b includes a PMOS transistor 73 and resistive elements 74 and 75.

The PMOS transistor 73 includes a source coupled to one end of the resistive element 75 and the supply voltage line, and a drain coupled to the other end of the resistive element 75 and one end of the resistive element 74. The signal CDS is input to a gate of the PMOS transistor 73. The other end of the resistive element 74 is coupled to the source of the PMOS transistor 71.

For example, when the signal CDS is at the "H" level, the PMOS transistor 73 is in an OFF state. In this instance, a current flows into the inverter 63a from the supply voltage line via the resistive elements 75 and 74. Assuming that the resistance value of the resistive element 74 is R1 and the resistance value of the resistive element 75 is R2, the combined resistance in the variable resistor 63b is then R1+R2, rendering the variable resistor 63b in the high resistance state. As such, the amount of current flowing into the supply voltage terminal of the inverter 63a becomes relatively small.

When the signal CDS is at the "L" level, the PMOS transistor 73 is in an ON state. In this instance, a current flows into the inverter 63a from the supply voltage line via the PMOS transistor 73 and the resistive element 74. Assuming that the ON resistance of the PMOS transistor 73 is Ron_p1, the combined resistance in the variable resistor 63b is R1+Ron_p1. The resistance values R2 and Ron_p1 are in the relationship R2>Ron_p1, and therefore, the variable resistor 63b is in the low resistance state. As such, the amount of current flowing into the supply voltage terminal of the inverter 63a is larger than that with the "H"-level signal CDS, providing a faster "L" to "H" level inversion of the output signals.

The master clock signal MCLK and the comparator clock signal CLK_C are asynchronous, and thus, the output signals of the flip-flop circuit 62 can be brought into a metastable state. That is, when the signal CDS is intermediate between the "L" level and the "H" level, the PMOS transistor 73 enters into a weak ON state. Assuming that the ON resistance of the PMOS transistor 73 in the weak ON state is Ron_p2, the relationship between the ON resistances Ron_p1 and Ron_p2 is Ron_p1<Ron_p2. The combined resistance in the variable resistor 63b at this time is R1+(R2+Ron_p2)/(R2·Ron_p2). Accordingly, the amount of current flowing into the supply voltage terminal of the inverter 63a is larger than that with the "H"-level signal CDS and smaller than that with the "L"-level signal CDS. As such, the "L" to "H" level inversion of the output signals of the inverter 63a is faster than that with the "H"-level signal CDS and slower than that with the "L"-level signal CDS.

4.2 Configuration of Second Variable Delay Inversion Circuit

The second variable delay inversion circuit 64 will be described with reference to FIG. 9. The fourth variable delay inversion circuit 66 is of the same configuration.

Figure 9:
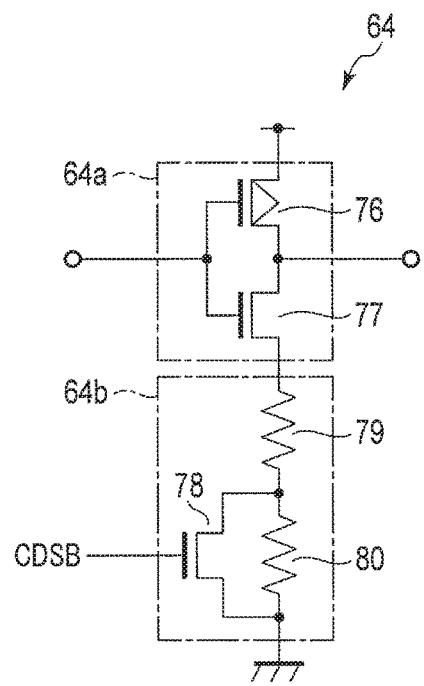
FIG. 9 is one circuit diagram for a second variable delay inversion circuit in the analog-to-digital converter according to the fourth embodiment.

As shown in FIG. 9, the inverter 64a includes a PMOS transistor 76 and an NMOS transistor 77, as in the case of the inverter 63a.

The PMOS transistor 76 includes a source coupled to the supply voltage line, and a drain coupled to a drain of the NMOS transistor 77 and the output terminal of the inverter 64a. A gate of the PMOS transistor 76 and a gate of the NMOS transistor 77 are coupled to the input terminal of the inverter 64a. A source of the NMOS transistor 77 is grounded via the variable resistor 64b.

The variable resistor 64b includes an NMOS transistor 78 and resistive elements 79 and 80.

One end of the resistive element 79 is coupled to the source of the NMOS transistor 77. The other end of the resistive element 79 is coupled to a drain of the NMOS transistor 78 and one end of the resistive element 80. A source of the NMOS transistor 78 and the other end of the resistive element 80 are grounded. The signal CDSB is input to a gate of the NMOS transistor 78.

For example, when the signal CDSB is at the "L" level, the NMOS transistor 78 is in an OFF state. In this instance, a current flows into the ground voltage line from the inverter 64a via the resistive elements 79 and 80. The variable resistor 64b is accordingly in the high resistance state. As such, the amount of current flowing into the ground voltage terminal of the inverter 64a becomes relatively small.

When the signal CDSB is at the "H" level, the NMOS transistor 78 is in an ON state. In this instance, a current flows into the ground voltage line from the inverter 64a via the resistive element 79 and the NMOS transistor 78. Accordingly, the variable resistor 64b is in the low resistance state. As such, the amount of current flowing into the ground voltage terminal of the inverter 64a is larger than that with the "L"-level signal CDSB, providing a faster "H" to "L" level inversion of the output signals.

Also, when the signal CDSB is intermediate between the "L" level and the "H" level, the NMOS transistor 78 enters into a weak ON state. Accordingly, the amount of current flowing into the ground voltage terminal of the inverter 64a is larger than that with the "L"-level signal CDSB and smaller than that with the "H"-level signal CDSB. As such, the "H" to "L" level inversion of the output signals of the inverter 64a is faster than that with the "L"-level signal CDSB and slower than that with the "H"-level signal CDSB.

4.3 Each Signal in AD Conversion Operations

Next, each signal in the AD conversion operations will be described with reference to FIG. 10. FIG. 10 is an example that shows in particular the ADC operation period for one cycle of the AD conversion, as in FIG. 4 in the first embodiment. In this example of FIG. 10, the signal CDSB is added. The following descriptions will concentrate on the differences from FIG. 4 in the first embodiment.

As shown in FIG. 10, the AD converter 23 starts the sampling operation at time t0. More specifically, the CLK generator 34 sets the sampling clock signal CLK_S to the "H" level. Also, the CLK_C output circuit 52 in the CLK_C generator 35 terminates the oscillation for the comparator clock signal CLK_C based on the output signal S_ct of the counter 53. The output signal CDSB of the flip-flop circuit 62 in the CLK_C delay circuit 51 is set to the "L" level.

For the period from time t2 through time t3, the CLK_C generator 35 sets the first settling period ST1 after the first through third pulse generations of the comparator clock signal CLK_C.

At time t3, the master clock signal MCLK transitions from the "H" level to the "L" level. For example, the CLK_C output circuit 52 outputs the fourth pulse of the comparator clock signal CLK_C during the transition period of the master clock signal MCLK. The flip-flop circuit 62 then takes in the transitioning master clock signal MCLK, and is brought into the meta-stable state, accordingly. This results in the output signal CDSB being unstable. In this case, the CLK_C delay circuit 51 sets the settling period after the fourth pulse of the comparator clock signal CLK_C (hereinafter, "third settling period ST3") to be longer than the second settling period ST2 and shorter than the first settling period ST1. The first through third settling periods ST1 through ST3 are in the relationship ST2<ST3<ST1.

For the period from time t3 through time t4, the CLK_C generator 35, in response to the "L"-level master clock signal MCLK, sets the second settling period ST2 after the fifth through seventh pulses of the comparator clock signal CLK_C.

4.4 Effect of Present Embodiment

The configurations according to this embodiment may be applied to the first to third embodiments. The same effect as in the first to third embodiments can thereby be attained.

Moreover, with the configurations according to this embodiment, it is possible to suppress the pulse cycles of the comparator clock signals CLK_C from becoming unstable when the CLK_C generator 35 is controlling the comparator clock signals CLK_C based on the master clock signal MCLK. More specifically, even when the output of the flip-flop circuit 62 in the CLK_C delay circuit 51 is in the meta-stable state, the settling periods of the comparator clock signals CLK_C can be controlled. Therefore, the reliability of the AD conversion operations by the AD converter can be improved.

5. Modification Examples, Etc.

The analog-to-digital converter according to the foregoing embodiments includes: a first digital-to-analog converter (30a) which is configured to generate a first analog voltage based on a sampled first analog signal (Va) and a digital code (S_dac); a comparator (31) to which the first analog voltage is input and which is configured to provide a digital output based on a first clock signal (CLK_C); a clock generator (35) which is configured to generate the first clock signal from an input clock signal (MCLK); and a controller (33) which is configured to generate the digital code based on the digital output (Vop, Von) of the comparator and to control the first digital-to-analog converter. The clock generator sets a cycle of the first clock signal to a first cycle if the input clock signal is at a first logic level ("H"), and sets the cycle of the first clock signal to a second cycle shorter than the first cycle if the input clock signal is at a second logic level ("L").

By adopting the foregoing embodiments, AD converters with an improved processing capability can be provided.

The embodiments are not limited to the foregoing descriptions but may be applied various modifications.

For example, the DACs in the embodiments are not limited to the configurations shown in FIG. 2. Other configurations using capacitive elements, or configurations using, for example, resistive elements instead of the capacitive elements, may be employed.

Furthermore, the successive-approximation type AD converters in the embodiments are not limited to the configurations shown in FIG. 2. The AD converters are not limited to successive-approximation type AD converters, either.

In the context of the foregoing embodiments, the state intended by the expression "couple" or "connect" includes indirect connections interposing other elements, such as transistors and resistors, between the coupled elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog-to-digital converter comprising:
    a first digital-to-analog converter configured to generate a first analog voltage based on a sampled first analog signal and a digital code;
    a comparator to which the first analog voltage is input, the comparator configured to provide a digital output based on a first clock signal;
    a clock generator configured to generate the first clock signal from an input clock signal; and
    a controller configured to generate the digital code based on the digital output of the comparator and to control the first digital-to-analog converter,
    wherein the clock generator sets a cycle of the first clock signal to a first cycle if the input clock signal is at a first logic level, and sets the cycle of the first clock signal to a second cycle shorter than the first cycle if the input clock signal is at a second logic level.

2. The analog-to-digital converter according to claim 1, wherein the clock generator includes a variable delay circuit configured to control a settling period after a pulse of the first clock signal based on the digital output of the comparator and the input clock signal.

3. The analog-to-digital converter according to claim 2, wherein the variable delay circuit includes:
    a first inverter including an input terminal to which a first signal based on the digital output is input, a supply voltage terminal coupled to a supply voltage line via a first variable resistor, and a grounded ground voltage terminal;
    a second inverter including an input terminal coupled to an output terminal of the first inverter, a supply voltage terminal coupled to the supply voltage line, and a ground voltage terminal grounded via a second variable resistor; and
    a flip-flop circuit including a data input terminal to which a second signal based on the input clock signal is input, and a clock input terminal to which the first clock signal is input, the flip-flop circuit configured to output a third signal for controlling the first variable resistor and a fourth signal for controlling the second variable resistor.

4. The analog-to-digital converter according to claim 3, wherein the first variable resistor includes:
    a first resistive element including one end coupled to the supply voltage terminal of the first inverter;
    a second resistive element including one end coupled to another end of the first resistive element, and another end coupled to the supply voltage line; and
    a first switch circuit coupled in parallel with the second resistive element and controlled based on the third signal.

5. The analog-to-digital converter according to claim 4, wherein the first switch circuit is placed in an OFF state if the input clock signal is at the first logic level, and in an ON state if the input clock signal is at the second logic level.

6. The analog-to-digital converter according to claim 3, wherein the second variable resistor includes:
    a third resistive element including one end coupled to the ground voltage terminal of the second inverter;
    a fourth resistive element including one end coupled to another end of the third resistive element, and grounded another end; and
    a second switch circuit coupled in parallel with the fourth resistive element and controlled based on the fourth signal.

7. The analog-to-digital converter according to claim 6, wherein the second switch circuit is placed in an OFF state if the input clock signal is at the first logic level, and in an ON state if the input clock signal is at the second logic level.

8. The analog-to-digital converter according to claim 2, wherein the clock generator further includes a comparison detector configured to output to the variable delay circuit, based on the digital output of the comparator, the first signal at a third logic level for a period during which the comparator performs comparison, and the first signal at a fourth logic level different from the third logic level for a period during which the comparator does not perform comparison.

9. The analog-to-digital converter according to claim 2, wherein the clock generator further includes:
    an output circuit configured to output the first clock signal based on a delay signal received from the variable delay circuit; and
    a counter configured to count a pulse number of the first clock signal,
    wherein the output circuit starts pulse generation of the first clock signal based on a fifth signal instructing start of the pulse generation, and terminates the pulse generation based on a sixth signal received from the counter.

10. The analog-to-digital converter according to claim 1, further comprising:
    a second digital-to-analog converter configured to generate a second analog voltage based on a sampled second analog signal and the digital code;
    wherein the comparator includes a first input terminal to which the first analog voltage is input, and a second input terminal to which the second analog voltage is input, and provides the digital output of a differential signal based on the first clock signal.

11. The analog-to-digital converter according to claim 1, wherein the first clock signal in the first cycle has a pulse width equal to the first clock signal in the second cycle, and the first clock signal in the first cycle has a settling period longer than that of the first clock signal in the second cycle.

12. The analog-to-digital converter according to claim 1, wherein the clock generator starts pulse generation of the first clock signal when the input clock signal is at the first logic level, and terminates the pulse generation when the input clock signal is at the second logic level.

13. The analog-to-digital converter according to claim 1, wherein the first digital-to-analog converter terminates sampling the first analog signal based on a timing at which the input clock signal switches from the second logic level to the first logic level.

14. The analog-to-digital converter according to claim 1, further comprising:
a register being capable of holding multiple bits of the digital output of the comparator,
wherein the controller generates the digital code based on signals of the respective bits held by the register.

15. The analog-to-digital converter according to claim 1, which is of a successive-approximation type.

16. A wireless communication device comprising:
a receiver including an analog-to-digital converter;
a processor configured to process a digital signal received from the receiver; and
a transmitter configured to convert a digital signal transmitted from the processor into an analog signal for output,
wherein the analog-to-digital converter includes:
a first digital-to-analog converter configured to generate a first analog voltage based on a sampled first analog signal and a digital code;
a comparator to which the first analog voltage from the first digital-to-analog converter is input, the comparator configured to provide a digital output based on a first clock signal;
a clock generator configured to generate the first clock signal from an input clock signal; and
a controller configured to generate the digital code based on the digital output of the comparator and to control the first digital-to-analog converter,
wherein the clock generator sets a cycle of the first clock signal to a first cycle if the input clock signal is at a first logic level, and sets the cycle of the first clock signal to a second cycle shorter than the first cycle if the input clock signal is at a second logic level.

17. The wireless communication device according to claim 16, wherein the clock generator includes a variable delay circuit configured to control a settling period after a pulse of the first clock signal based on the digital output of the comparator and the input clock signal.

18. The wireless communication device according to claim 17, wherein the variable delay circuit includes:
a first inverter including an input terminal to which a first signal based on the digital output is input, a supply voltage terminal coupled to a supply voltage line via a first variable resistor, and a grounded ground voltage terminal;
a second inverter including an input terminal coupled to an output terminal of the first inverter, a supply voltage terminal coupled to the supply voltage line, and a ground voltage terminal grounded via a second variable resistor; and
a flip-flop circuit including a data input terminal to which a second signal based on the input clock signal is input, and a clock input terminal to which the first clock signal is input, the flip-flop circuit configured to output a third signal for controlling the first variable resistor and a fourth signal for controlling the second variable resistor.

19. The wireless communication device according to claim 16, wherein the first clock signal in the first cycle has a pulse width equal to the first clock signal in the second cycle, and
the first clock signal in the first cycle has a settling period longer than that of the first clock signal in the second cycle.

20. The wireless communication device according to claim 16, wherein the clock generator starts pulse generation of the first clock signal when the input clock signal is at the first logic level, and terminates the pulse generation when the input clock signal is at the second logic level.

* * * * *